United States Patent

[11] 3,586,926

[72] Inventors Yoshiaki Nakamura;
Kazuhiko Yoshikawa, both of Tokyo, Japan
[21] Appl. No. 779,509
[22] Filed Nov. 27, 1968
[45] Patented June 22, 1971
[73] Assignee Nippon Electric Company, Limited
Tokyo, Japan
[32] Priority Nov. 30, 1967
[33] Japan
[31] 42/77134

[54] HERMETICALLY SEALED SEMICONDUCTOR DEVICE WITH ABSORPTIVE AGENT
3 Claims, 7 Drawing Figs.

[52] U.S. Cl. .......... 317/234 R, 317/235 R, 317/234 D, 317/234 G, 313/174, 252/181.1, 252/181.6
[51] Int. Cl. .......... H01l 1/10
[50] Field of Search .......... 317/234, 2, 4; 252/181.1, 181.6; 313/174

[56] References Cited

UNITED STATES PATENTS

| | | | |
|---|---|---|---|
| 3,220,095 | 11/1965 | Smith | 29/155.5 |
| 2,902,633 | 9/1969 | Durst et al. | 317/234 |
| 3,241,217 | 4/1966 | Num | 29/155.5 |
| 3,181,229 | 5/1965 | Hakerecht et al. | 29/155.5 |
| 3,216,084 | 11/1965 | Flaschen et al. | 29/25.3 |
| 3,259,490 | 7/1966 | Flaschen et al. | 75/134 |

*Primary Examiner*—John W. Huckert
*Assistant Examiner*—B. Estrin
*Attorney*—Hopgood and Calimafde

ABSTRACT: A hermetically sealed semiconductor device is described. Within a hermetically sealed container an anhydrous organic salt is placed to form a strong adsorbent agent for the adsorption of water and other undesired substances. Copper sulfate is a preferred organic salt from which the water of crystallization has been removed before the sealing of the container.

Figure 1A:
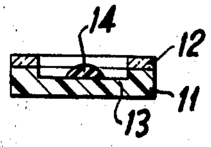

INVENTORS
YOSHIAKI NAKAMURA
KAZUHIKO YOSHIKAWA
BY
Hopgood & Calimafde
ATTORNEYS

HERMETICALLY SEALED SEMICONDUCTOR DEVICE WITH ABSORPTIVE AGENT

This invention relates to a semiconductor device in which a desiccant or adsorbent is sealed in its container.

Conventional semiconductor devices are susceptible to the influences of the atmosphere. For the stabilization of the devices, it has been the practice to introduce dry, inert gas into the hermetically sealed container through a sealing process. However, it is impossible with such process to remove water vapor and impure gases completely from the container, and some of these contents are left unremoved after the sealing process is completed. Sometimes these remaining contents have adverse effects upon the electrical characteristics of the semiconductor device. Generally, heating of semiconductor devices to a temperature of from about 200° to about 300° C. during the process of sealing, testing or use thereof may result in the separation and removal of the water content or polar substance from the inner wall of the semiconductor devices and from the sealing material deposited thereon. The polar substance as well as water is either deposited or adsorbed on the surfaces of various semiconductor materials and thereby deteriorate their electric characteristics, particularly the leakage current characteristics. As the vapor pressure of the polar substance in the airtight container rises upon heating, the substance tends to be readily adsorbed on the surface of semiconductor materials. Once deposited on the surface in this way, the substance continues to be liberated from the source because of a drop in vapor pressure in the airtight container, and an increasing amount of deposit is observed in succession over the entire element surface. The adsorbed substance gradually forms electrically conductive leakage paths on the surface of the semiconductor element and thereby increases the leakage current through the particular semiconductor device. For this reason, it is extremely difficult to reliably manufacture by conventional technique a semiconductor device wherein leakage current is economically avoided.

It is therefore the object of this invention to provide a highly reliable semiconductor device in an airtight container with little leakage current by preventing the formation of a current leakage path caused by the adsorbance of water and polar substance.

According to the present invention, a semiconductor element is enclosed in an airtight container with an anhydrous inorganic salt which was previously prepared by release of some of its hydrate water. The anhydrous inorganic salt applied in the present invention is so powerful with its positive adsorption of water or a polar substance that semiconductor adsorption of such substances occurs only negligibly. While the concept of including substances in airtight containers has heretofore been entertained in the prior art, leading to the adoption of molecular sieves, the anhydrous inorganic salt in the practice of the present invention exhibits even greater strength of adsorption than that of a molecular sieve. This is presumably accounted for by the fact that the power of adsorption exercised by the inorganic salt upon dehydration of the salt which normally contains water of crystallization is attributable to a strong chemical adsorption unlike the case with the molecular sieve.

When an inorganic salt having water of crystallization such as copper sulfate which contains much coordinate water is forced as by heating to release its hydrate water completely, the salt will then attain a new coordination capacity for other polar substances, and therefore the polar substance present in the airtight container will serve as a coordinator. It thus follows that the polar substance adsorbed on the surface of the inorganic salt will be strongly bonded therewith to form a stable complex body. Since the adsorption takes place at an elevated temperature, it falls under the category of so-called chemical adsorption which is all the more contributory to the stability of the complex body. Thus, once adsorbed, the substance will not readily come off the surface regardless of the temperatures. Herein lies the superiority of this type of adsorption to that of a molecular sieve.

The present invention will be more fully described hereunder in conjunction with the accompanying drawings showing embodiments thereof.

Figure 1B:
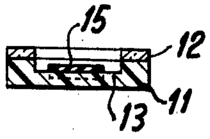
Figure 2:
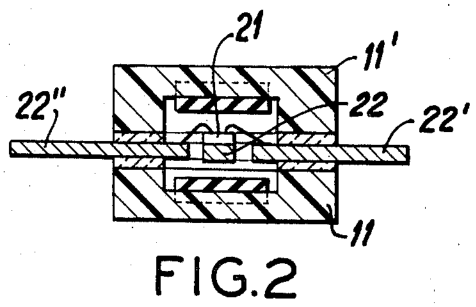
Figure 3A:
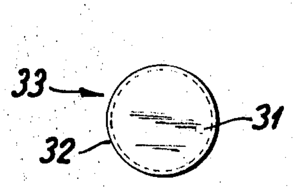
Figure 3B:
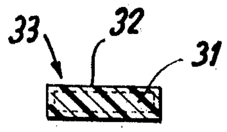
Figure 4A:
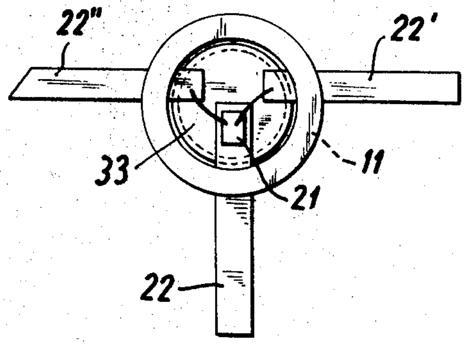
Figure 4B:
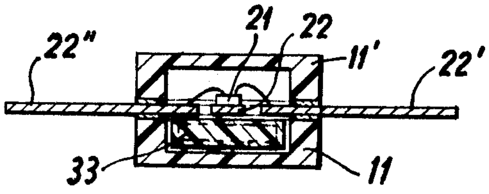

Referring to FIGS. 1A, 1B and 2 which show a preferred embodiment of the invention, a semiconductor device is obtained by holding leads 22, 22′, 22″ to which a semiconductor element 21 is secured at one side in a ceramic container 11 composed of two plates each 3.5 mm. in diameter and 0.6 mm. in height, provided with a glass lining 12 having a thickness of about 1.5 mm. along the periphery of each plate and provided with an inorganic salt of copper sulfate deposited as an adsorbent on the inner wall 13. In this embodiment the adhesion of the adsorbent to the inner wall of the ceramic container is attained, as shown in FIGS. 1A and B, by dropping about 0.01 cc. of a solution of an inorganic salt on the inner wall 13 of ceramic container 11. The organic salt contains water of crystallization at normal temperature and releases the water at a temperature lower than the container sealing temperature. The salt further has a decomposition temperature which is higher than the container sealing temperature. The organic salt may be for example an aqueous solution 14 containing 10 percent copper sulfate. Thereafter the container with the salt is heated in an oven at 300° C. to dehydrate the salt and release the water of crystallization from the copper sulfate. As the aqueous solution of an inorganic salt which contains coordinate water at normal temperature is dehydrated at an elevated temperature, the bonding force between the ceramic surface and the inorganic salt is increased because the inner wall of the ceramic is porous and hence has a large area contact with the salt and also because the inorganic salt after dehydration remains as a thin film. Thus a sufficient bond strength is attained the anhydrated inorganic salt and the ceramic so that the former will not be separated from the ceramic surface by mechanical impact. The amount of the adsorbent can be increased or decreased depending upon the size of the container in which the semiconductor element is hermetically sealed. Any water and polar substance liberated from the inner wall of the ceramic container and the upper and lower caps 12 of glass are adsorbed by the adsorbent. Therefore, the surface of the semiconductor element can be kept clean. Further, because the adsorption by the inorganic salt occurs in the form of chemical adsorption, the polar substance adsorbed will not be separated from the adsorbent regardless of the temperatures at which the semiconductor device is used. The container to which the adsorbent is secured preferably provides a large contact area with the adsorbent. The container may be formed of a metal provided that the inner wall is roughened to reinforce the bond between the adsorbent and the metal surface.

According to another embodiment of the invention illustrated in FIGS. 3A, 3B, 4A and 4B, a porous material 31 such as ceramic is infiltrated beforehand by an inorganic salt 32 therein to be thereafter subjected to a dehydration treatment at a temperature between 200° and 300° C. to be thereafter resultant adsorbent element 33 is put together with a semiconductor element into a ceramic container formed of members 11, 11′, and then the container is hermetically sealed. Thus, a semiconductor device is produced. In this embodiment, the adsorbent is easily bonded in place, and a container of desirable material can be arbitrarily chosen. It is also possible to choose a desired shape and size of porous material and adjust the amount of the adsorbent as desired depending upon the capacity of the hermetic container.

As will be clear from the foregoing description, the semiconductor device according to the present invention has improved electrical characteristics and reliability because the water content and polar substances can be removed from the airtight container by simply introducing an anhydrous inorganic salt as an adsorbent therein. There is no limitation to the type of inorganic salts to be used as adsorbents in accordance with the present invention. Any such salt, however, must have water of crystallization which contains much coordinate water at normal temperature. Furthermore the release of the hydrate water must be attained at temperatures below the sealing temperature of the semiconductor device and the decomposition temperature of the salt must be above the sealing temperature. Thus, not only copper sulfate, referred to in the above embodiments, but also other inorganic salts such as nickel chloride and nickel sulfate may be employed.

The present invention is apparently adaptable to the whole of semiconductor devices, irrespective of the applications such as diodes, transistors and integrated circuits.

We claim:

1. A hermetically sealed semiconductor device comprising a hermetically sealed container, a semiconductor element enclosed within the container, and an anhydrous inorganic salt selected from the group consisting of copper sulfate, nickel chloride and nickel sulfate placed within the container to adsorb substances within the container.

2. The device as recited in claim 2 wherein said container is formed of a ceramic material bonded to said anhydrous inorganic salt.

3. The device as recited in claim 2 and further including
a ceramic porous material placed within the container with the semiconductor element, and
wherein said organic salt in its anhydrous state is permeated throughout pores of said ceramic porous material.